(12) United States Patent
Miller et al.

(10) Patent No.: US 10,741,452 B2
(45) Date of Patent: Aug. 11, 2020

(54) CONTROLLING FIN HARDMASK CUT PROFILE USING A SACRIFICIAL EPITAXIAL STRUCTURE

(71) Applicant: INTERNATIONAL BUSINESS MACHINES CORPORATION, Armonk, NY (US)

(72) Inventors: Eric R. Miller, Watervliet, NY (US); Stuart A. Sieg, Albany, NY (US); Yann Mignot, Slingerlands, NY (US); Indira Seshadri, Niskayuna, NY (US); Christopher J. Waskiewicz, Rexford, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/173,378

(22) Filed: Oct. 29, 2018

(65) Prior Publication Data
US 2020/0135570 A1    Apr. 30, 2020

(51) Int. Cl.
| H01L 21/8234 | (2006.01) |
| H01L 21/308 | (2006.01) |
| H01L 21/033 | (2006.01) |
| H01L 29/66 | (2006.01) |
| H01L 27/088 | (2006.01) |

(52) U.S. Cl.
CPC .. *H01L 21/823431* (2013.01); *H01L 21/0337* (2013.01); *H01L 21/3086* (2013.01); *H01L 27/0886* (2013.01); *H01L 29/6681* (2013.01)

(58) Field of Classification Search
None
See application file for complete search history.

(56) References Cited

U.S. PATENT DOCUMENTS

| 8,658,536 | B1 | 2/2014 | Choi et al. |
| 8,703,557 | B1 | 4/2014 | Cai et al. |
| 9,147,730 | B2 | 9/2015 | Xie et al. |
| 9,425,106 | B1 | 8/2016 | Xie et al. |
| 9,741,823 | B1 | 8/2017 | Greene et al. |
| 9,847,418 | B1 | 12/2017 | Lim et al. |
| 10,002,795 | B1 | 6/2018 | Bi et al. |
| 2010/0048026 | A1* | 2/2010 | Sone .................. H01L 21/0206 438/710 |
| 2015/0145065 | A1* | 5/2015 | Kanakasabapathy ........................ H01L 27/0886 257/401 |
| 2016/0172380 | A1 | 6/2016 | Kanakasabapathy et al. |
| 2016/0268123 | A1* | 9/2016 | de Souza ................ H01L 29/16 |
| 2017/0358660 | A1 | 12/2017 | Cheng et al. |

(Continued)

*Primary Examiner* — Jay C Chang
(74) *Attorney, Agent, or Firm* — Tutunjian & Bitetto, P.C.; Vazken Alexanian

(57) ABSTRACT

Methods for forming semiconductor fins include forming a sacrificial semiconductor structure around a hardmask fin on an underlying semiconductor layer. A first etch is performed that partially etches away a portion of the hardmask fin and the sacrificial semiconductor structure with a first etch chemistry. A second etch is performed that etches away remaining material of the portion of the hardmask fin and partially etches remaining material of the sacrificial semiconductor structure with a second etch chemistry. A semiconductor fin is etched from the semiconductor layer using the etched hardmask fin as a mask.

20 Claims, 4 Drawing Sheets

(56) References Cited

U.S. PATENT DOCUMENTS

2018/0069113 A1    3/2018  Cheng et al.
2018/0174854 A1*  6/2018  Tseng .................. H01L 21/3086

* cited by examiner

CONTROLLING FIN HARDMASK CUT PROFILE USING A SACRIFICIAL EPITAXIAL STRUCTURE

BACKGROUND

Technical Field

The present invention generally relates to semiconductor device fabrication and, more particularly, to fabrication processes that improve fin length uniformity by providing consistent hardmask profiles.

Description of the Related Art

There are a variety of techniques for forming fins from a semiconductor layer. In general, however, these techniques all involve the formation a mask that is used to define the fin position and dimensions, followed by an anisotropic etch into the semiconductor around the mask. The formation of the mask itself poses its own challenges, particularly in cutting mask fins to a consistent size. Inconsistent mask sizes, for example resulting from an imperfect etch that leaves sloped mask walls, result in a lack of uniformity in the semiconductor fins that are created. This fin length variation results in variances in finished device properties and can result in fabrication errors that decrease manufacturing yield.

SUMMARY

A method for forming a semiconductor fin includes forming a sacrificial semiconductor structure around a hardmask fin on an underlying semiconductor layer. A first etch is performed that partially etches away a portion of the hardmask fin and the sacrificial semiconductor structure with a first etch chemistry. A second etch is performed that etches away remaining material of the portion of the hardmask fin and partially etches remaining material of the sacrificial semiconductor structure with a second etch chemistry. A semiconductor fin is etched from the semiconductor layer using the etched hardmask fin as a mask.

A method for forming semiconductor fins includes epitaxially growing a sacrificial semiconductor structure around hardmask fins from a top surface of an underlying semiconductor layer. A first etch is performed that partially etches away a portion of the hardmask fins and the sacrificial semiconductor structure with a first etch chemistry. A second etch is performed that etches away remaining material of the portion of the hardmask fins and partially etches remaining material of the sacrificial semiconductor structure with a second etch chemistry. The first and second etch leave a remaining portion of the hardmask fin with substantially vertical sidewalls. Semiconductor fins are etched from the semiconductor layer using the etched hardmask fins as a mask.

A method for forming semiconductor fins includes epitaxially growing a sacrificial semiconductor structure around hardmask fins from a top surface of an underlying semiconductor layer. A mask is formed over the hardmask fins that leaves the portion of the hardmask fins exposed, after forming the sacrificial semiconductor structure. A first etch is performed that partially etches away a portion of the hardmask fins and the sacrificial semiconductor structure with a first etch chemistry. A second etch is performed that etches away remaining material of the portion of the hardmask fins and partially etches remaining material of the sacrificial semiconductor structure with a second etch chemistry. The first and second etch leave a remaining portion of the hardmask fins with substantially vertical sidewalls. A third etch is performed that etches away remaining portions of the semiconductor after the second etch and that is selective to the etched hardmask fins and the underlying semiconductor layer. Semiconductor fins are etched from the semiconductor layer using the etched hardmask fins as a mask.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide semiconductor devices that have superior fin length uniformity. This is accomplished by forming a protective epitaxial structure between the hardmask fins before cutting the hardmask fins to size. The protective structure enables the use of etch chemistries that provide a superior hardmask fin profile without risking damage to the underlying semiconductor substrate.

Figure 1:
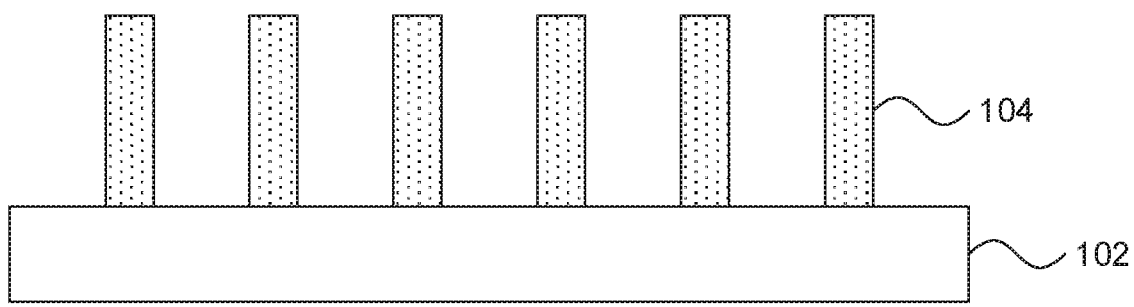
FIG. 1 is a cross-sectional diagram of a step in the formation of fin structures that shows the formation of hardmask fins on a semiconductor layer in accordance with an embodiment of the present invention.

Referring now to the drawings in which like numerals represent the same or similar elements and initially to FIG. 1, a cross-sectional view of a step in the formation of a set of semiconductor fins having sharp fin profiles is shown. A set of hardmask fins 104 is formed on a semiconductor layer 102. The composition of the hardmask fins 104 is shown herein as being a single layer of dielectric material, such as silicon nitride, but it should be understood that other compositions are contemplated, in particular fins formed from alternating layers of silicon oxide and silicon nitride. The hardmask fins 104 can be formed by any appropriate anisotropic etch such as, e.g., a reactive ion etch (RIE).

The semiconductor layer 102 may be a bulk-semiconductor substrate. Although the semiconductor layer 102 is shown herein as being relatively thin, it should be understood that the bulk of the semiconductor layer thickness is not shown unless needed in the interest of compact depiction. In one example, a bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the semiconductor layer 102 may also be a semiconductor on insulator (SOI) substrate. In other embodiments, the semiconductor layer 102 may be formed from a multi-layer structure of different semiconductor layers, for example alternating layers of a channel material and layers of a sacrificial material.

The fins 104 can be pre-cleaned before a subsequent epitaxial growth process by, e.g., depositing a protective oxide layer, if the hardmask fins 104 include an oxide material, and then performing a cleaning process. The pre-clean removes any adventitious oxides or contaminants from the surface of the semiconductor layer 102. The chemistry of the pre-clean can damage certain hardmask materials, so the protective oxide layer is used to prevent damage to the hardmask fins 104.

Figure 2:
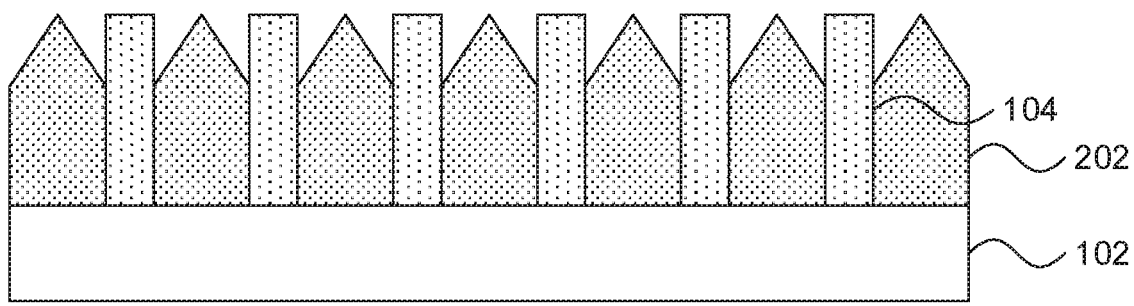
FIG. 2 is a cross-sectional diagram of a step in the formation of fin structures that shows the formation sacrificial epitaxial semiconductor structures in accordance with an embodiment of the present invention.

Referring now to FIG. 2, a cross-sectional view of a step in the formation of a set of semiconductor fins having sharp fin profiles is shown. Sacrificial semiconductor structures 202 are grown from the top surface of the semiconductor layer 102. In one particular embodiment, it is specifically contemplated that the sacrificial semiconductor structures 202 may be epitaxially grown from a silicon germanium material on a silicon substrate, but it should be understood that any appropriate materials may be used if they have appropriate etch selectivity and are crystallographically compatible. As used herein, the term "selective" in reference to a material removal process denotes that the rate of material removal for a first material is greater than the rate of removal for at least another material of the structure to which the material removal process is being applied.

The term "epitaxial growth" means the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

Figure 3:
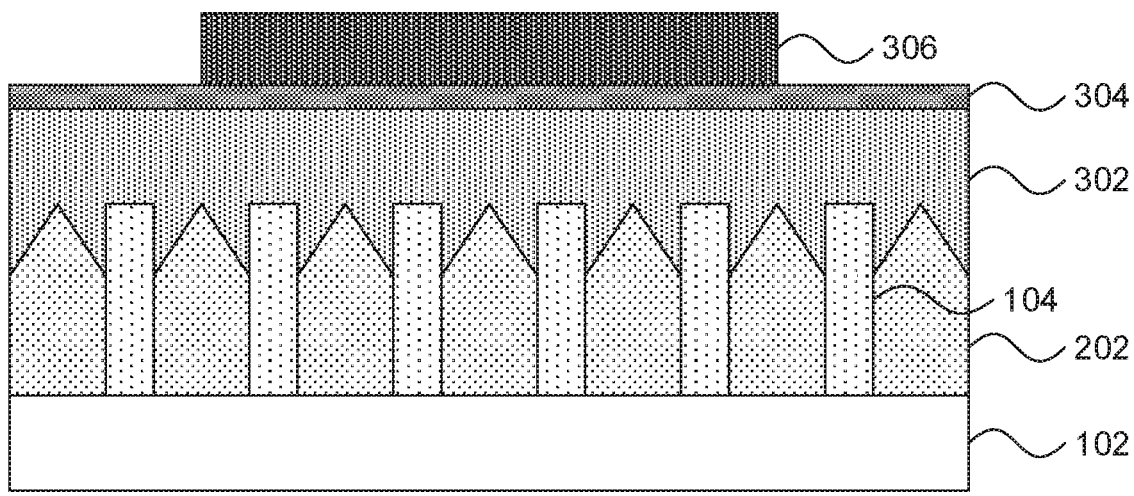
FIG. 3 is a cross-sectional diagram of a step in the formation of fin structures that shows the formation of a planarizing layer and mask in accordance with an embodiment of the present invention.

Referring now to FIG. 3, a cross-sectional view of a step in the formation of a set of semiconductor fins having sharp fin profiles is shown. A layer of fin masking material 302 is deposited over the fins 104 and the sacrificial semiconductor structures 202. An anti-reflective coating 304 is deposited over the layer of fin masking material 302. A pattern mask 306 is formed on the anti-reflective coating 304. It is specifically contemplated that the fin masking material 302 can be formed from an organic polymer and that the anti-reflective coating can be formed from a layer of silicon having a thickness that is appropriate to inhibit reflections from the underlying fin masking material 302. The pattern mask 306 is formed from any appropriate masking material that is opaque at wavelengths used to pattern the fin masking material 302.

Figure 4:
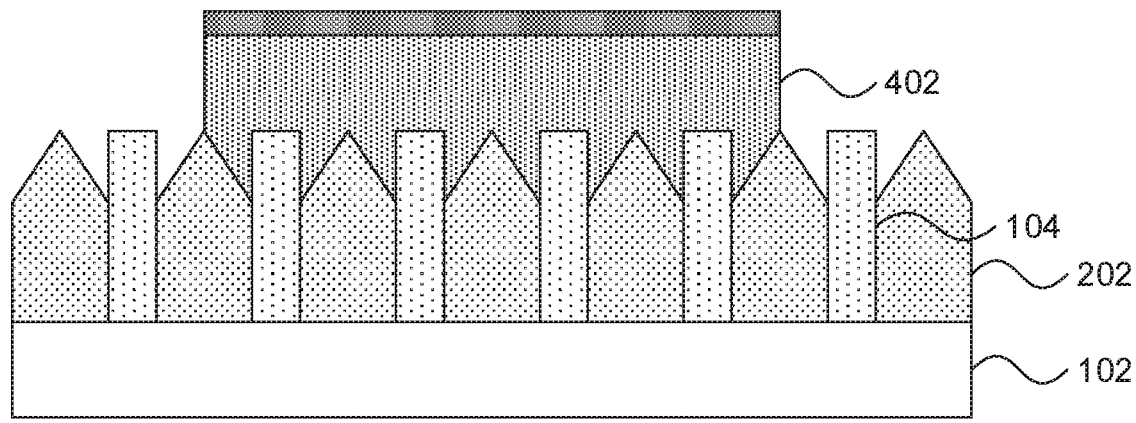
FIG. 4 is a cross-sectional diagram of a step in the formation of fin structures that shows the patterning of the planarizing layer using the mask in accordance with an embodiment of the present invention.

Referring now to FIG. 4, a cross-sectional view of a step in the formation of a set of semiconductor fins having sharp fin profiles is shown. The pattern mask 306 is used as a mask to pattern the underlying fin masking material 302, causing the exposed material to be removed, leaving behind fin mask 402. In particular, it should be understood that some of the hardmask fins 104 are partially covered by the fin mask 402, with one or more ends of the hardmask fins 104 extending out of the fin mask 402.

In one particular embodiment, the exposed portion of the anti-reflective coating 304 is etched away using a plasma etch that includes $CF_4/CHF_3$. The exposed portion of the organic planarizing layer 302 is etched away using any appropriate etch including $CO_2/CO$, $N_2/H_2$, or $HBr/He/O_2$ etches, removing the resist 306 at the same time.

Figure 5:
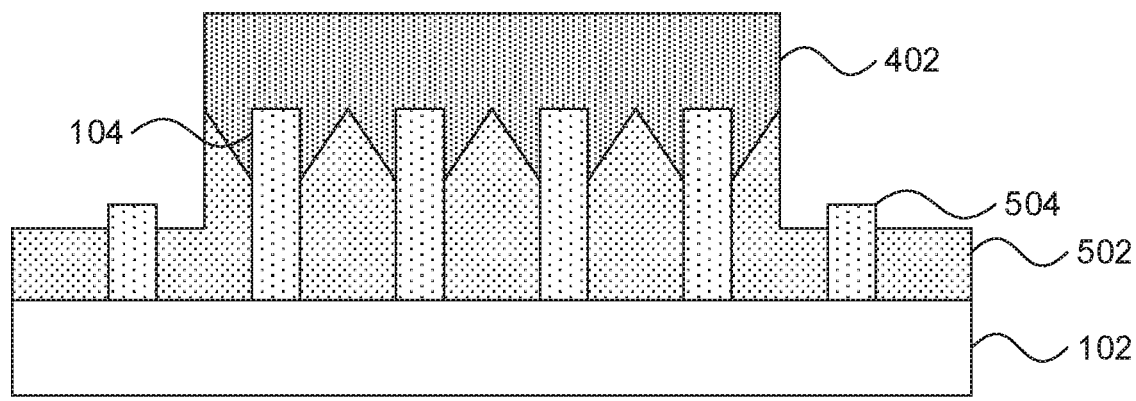
FIG. 5 is a cross-sectional diagram of a step in the formation of fin structures that shows etching back the hardmask fins and the sacrificial semiconductor structures in a first etch in accordance with an embodiment of the present invention.

Referring now to FIG. 5, a cross-sectional view of a step in the formation of a set of semiconductor fins having sharp fin profiles is shown. A partial etch of the exposed hardmask fins 104 is performed. These exposed portions are etched away, and because of the etch used, are formed with sharp, vertical edges, without the sloping that can result from less aggressive etch chemistries. The etch also removes material from the semiconductor structures 202. The result is a set of partially etched portions 504 of the hardmask fins 104 and partially etched semiconductor structure 502. Hardmask fins 104 and epitaxial layer 202 can be partially etched during a single etch sequence or with two separate etches, allowing better selectivity. Exemplary etch chemistries for the a silicon epitaxial material, such as semiconductor structures 202 in some embodiments, can be $Cl_2$, $SF_6$, or HBr with O2/Ar/He/N2 as dilution gas. For hardmask fins 104, exemplary etch chemistry include $CH_3F$ and/or $CF_x$ base for SiN and $SiO_2$.

Figure 6:
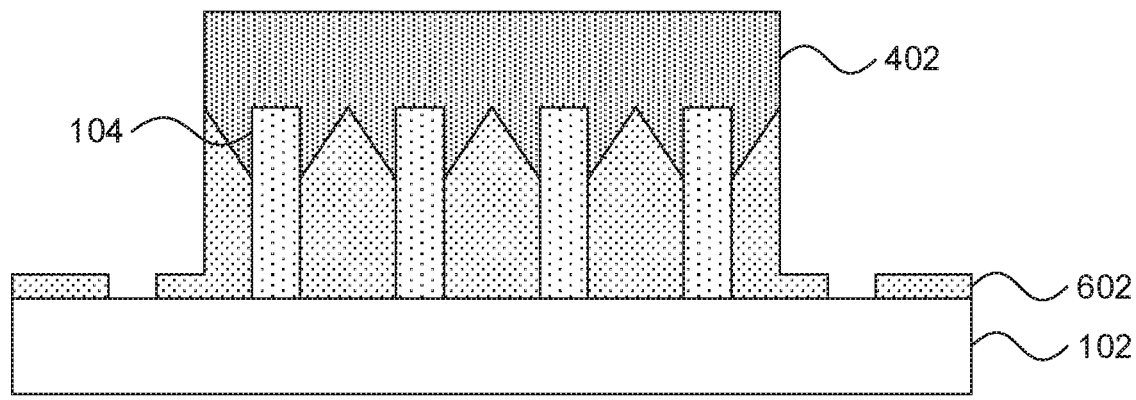
FIG. 6 is a cross-sectional diagram of a step in the formation of fin structures that shows etching away the hardmask fins and etching back the sacrificial semiconductor structures in a second etch in accordance with an embodiment of the present invention.

Referring now to FIG. 6, a cross-sectional view of a step in the formation of a set of semiconductor fins having sharp fin profiles is shown. The remaining material from the partially etched portions 504 of the hardmask fins 104 is etched away, exposing the surface of the semiconductor layer 102 underneath. At least a portion 602 of the exposed regions of the sacrificial semiconductor structures 202 remains on the semiconductor layer 102.

Figure 7:
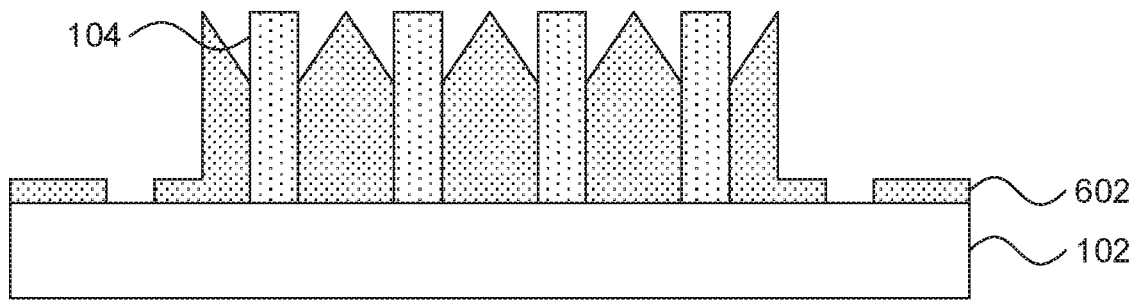
FIG. 7 is a cross-sectional diagram of a step in the formation of fin structures that shows removing the planarizing layer in accordance with an embodiment of the present invention.

Referring now to FIG. 7, a cross-sectional view of a step in the formation of a set of semiconductor fins having sharp fin profiles is shown. The fin mask 402 is etched away using any appropriately selective etch chemistry such as $O_2$ or $N_2/H$ for example, exposing the remaining hardmask fins 104.

Figure 8:
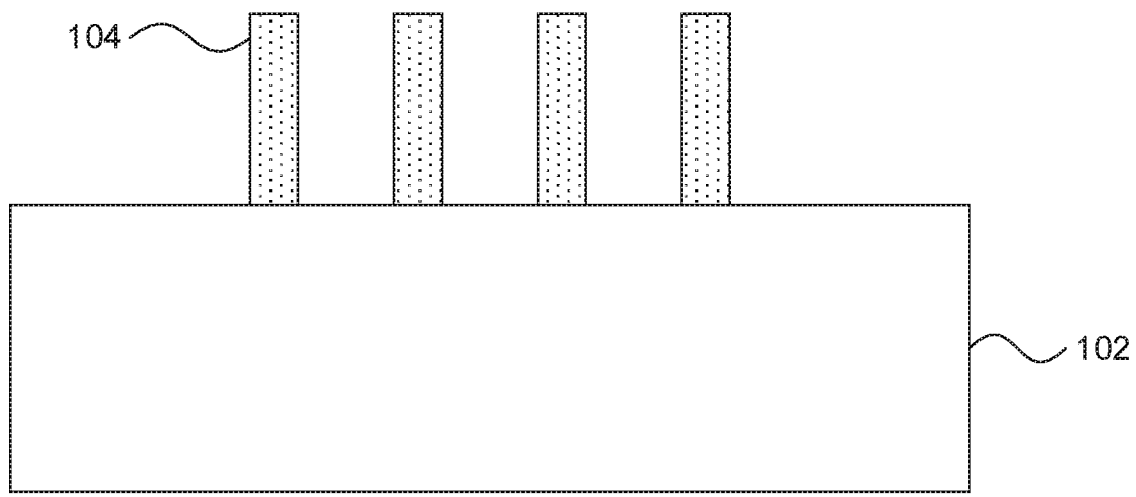
FIG. 8 is a cross-sectional diagram of a step in the formation of fin structures that shows etching away the remaining sacrificial semiconductor material in accordance with an embodiment of the present invention.

Referring now to FIG. 8, a cross-sectional view of a step in the formation of a set of semiconductor fins having sharp fin profiles is shown. The remaining sacrificial semiconductor material is etched away using a selective etch that leaves the semiconductor layer 102 unharmed. The result is a set of remaining hardmask fins 104 with sharply defined fin profiles. A greater thickness of the semiconductor layer 102 is shown in FIG. 8 to show the material from which semiconductor fins will be formed.

Figure 9:
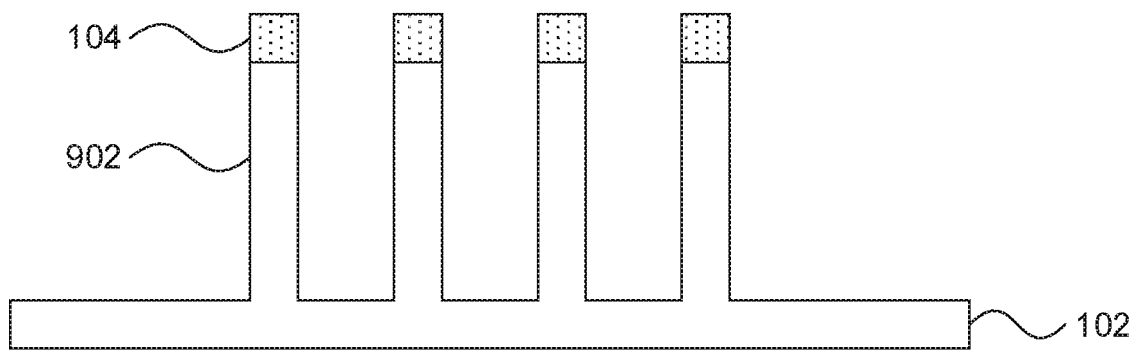
FIG. 9 is a cross-sectional diagram of a step in the formation of fin structures that shows etching semiconductor fins from an underlying semiconductor layer using the remaining portions of the hardmask fins as a mask in accordance with an embodiment of the present invention.

Referring now to FIG. 9, a cross-sectional view of a step in the formation of a set of semiconductor fins having sharp fin profiles is shown. The hardmask fins 104 are used as a mask to anisotropically etch down into the semiconductor layer 102 to form semiconductor fins 902 using, e.g., RIE. The depth of the etch can be controlled by, e.g., timing the etch process according to a known rate of material removal. A portion of the hardmask fins 104 can remain on top of the semiconductor fins 902.

RIE is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching, and laser ablation.

At this point, the semiconductor fins 902, along with any remaining portions of the hardmask fins 104, can be used to form any appropriate semiconductor device, such as a fin field effect transistor (finFET) or an electronically-triggered fuse. In the case of a finFET, portions of the semiconductor fins 902 can be doped to form source and drain regions and a gate stack can be formed over a channel region of the semiconductor fins 902. In the case of a fuse, a fuse region of the semiconductor fins 902 can be made conductive by forming a silicide or similarly metallized region. The fuse region can then be broken by electromigration through the application of an appropriately high voltage.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 10:
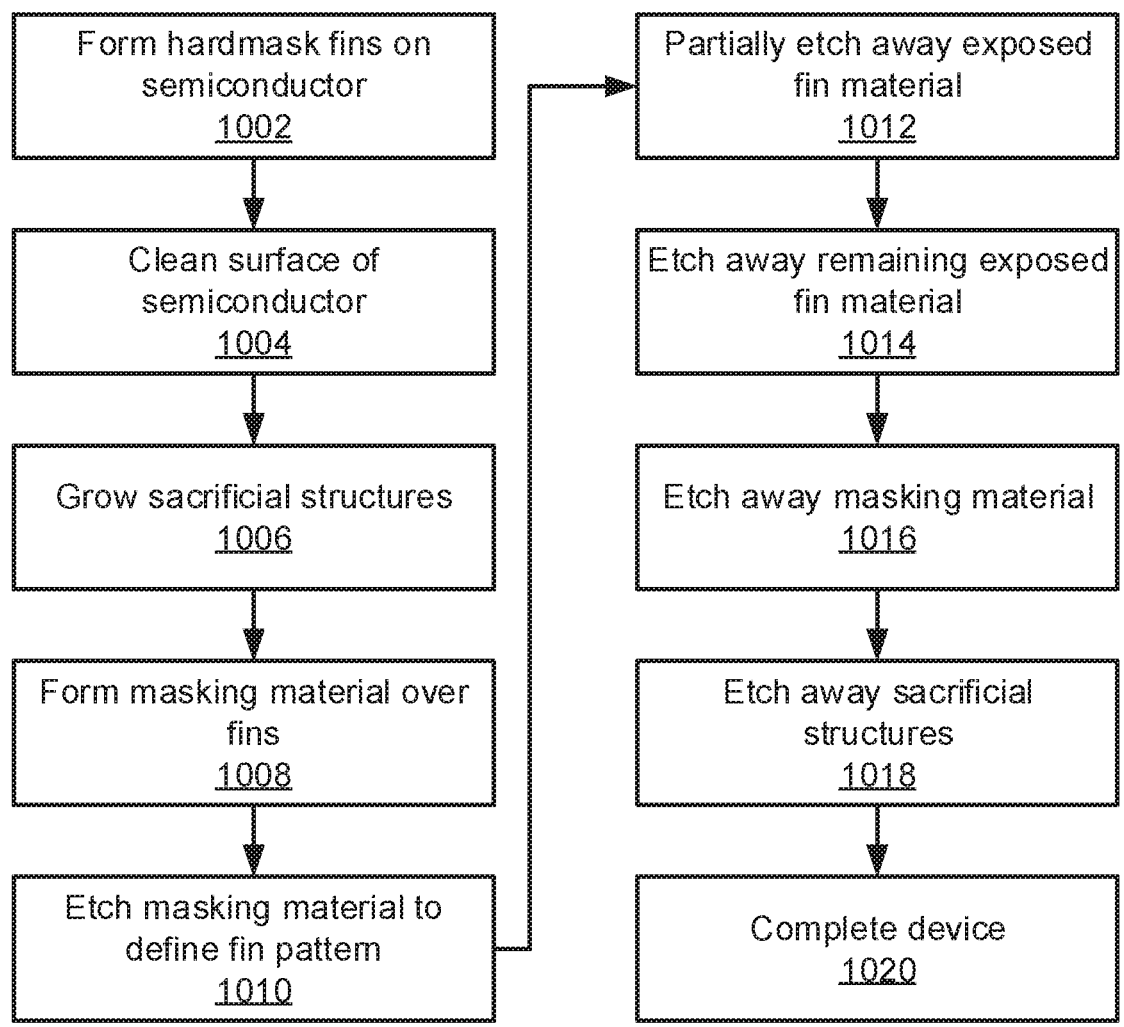
FIG. 10 is a block/flow diagram of a method of forming semiconductor fins in accordance with an embodiment of the present invention.

Referring now to FIG. 10, a block/flow diagram of a method for forming a fin-based semiconductor device is shown. Block 1202 forms hardmask fins 104 on a semiconductor layer 102. As noted above, the hardmask fins 104 can be formed from one or more layers of dielectric material that are anisotropically etched down to the underlying semiconductor layer 102.

Block 1004 cleans the surface of the semiconductor layer 102 and block 1006 then grows sacrificial structures 202 from the surface of the semiconductor layer 102. The sacrificial structures 202 can be formed by epitaxial growth of a semiconductor material, such as silicon germanium. Block 1008 forms a layer of masking material 302, such as an organic planarizing layer, over the fins 104 and the sacrificial structures 202. The masking layer may also include an anti-reflective coating 304. Block 1010 uses a pattern mask 306 to etch the masking material 302 to define a fin pattern, with at least a portion of the fins 104 being exposed by the fin pattern.

Block 1012 partially etches away the exposed material of the hardmask fins 104. An appropriate etch chemistry is selected to create a sharp fin profile, with vertical or near-vertical sidewalls. Block 1014 then etches away the remaining fin material, exposing the underlying semiconductor layer 102. Block 1016 etches away the masking material and block 1018 etches away the sacrificial structures 202, leaving behind the hardmask fins 104 on the semiconductor layer 102. Block 1020 completes the semiconductor device, forming such additional structures as are needed to fabricate, for example, an operational transistor or fuse.

Having described preferred embodiments of improved fin cut profiles using a sacrificial epitaxial structure (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a semiconductor fin, comprising:
forming a sacrificial semiconductor structure around a hardmask fin on an underlying semiconductor layer;
performing a first etch that partially etches away a portion of the hardmask fin and the sacrificial semiconductor structure at a same time, with a first etch chemistry;
performing a second etch that etches away remaining material of the portion of the hardmask fin and partially etches remaining material of the sacrificial semiconductor structure at a same time, with a second etch chemistry; and
etching a semiconductor fin from the underlying semiconductor layer using the etched hardmask fin as a mask.

2. The method of claim 1, wherein forming the sacrificial semiconductor structure comprises epitaxially growing the sacrificial semiconductor structure from a top surface of the underlying semiconductor layer.

3. The method of claim 1, wherein the second etch leaves a layer of remaining material of the sacrificial semiconductor structure and exposes the underlying semiconductor layer under the portion of the hardmask fin.

4. The method of claim 1, further comprising etching away remaining portions of the sacrificial semiconductor structure after the second etch.

5. The method of claim 4, wherein etching away the remaining portions of the sacrificial semiconductor structure employs a third etch chemistry that is selective to the etched hardmask fin and the underlying semiconductor layer.

6. The method of claim 1, further comprising:
forming a mask over the hardmask fin that leaves the portion of the hardmask fin exposed, after forming the sacrificial semiconductor structure.

7. The method of claim 1, wherein the first etch comprises an etch chemistry selected from the group consisting of $CH_3F$ and $CF_x$.

8. The method of claim 1, wherein the second etch comprises an etch chemistry selected from the group consisting of $Cl_2$, $SF_6$, and HBr.

9. The method of claim 1, wherein the first and second etch leave a remaining portion of the hardmask fin with substantially vertical sidewalls.

10. The method of claim 1, further comprising forming a plurality of hardmask fins on the underlying semiconductor layer, wherein forming the sacrificial semiconductor structure around the hardmask fin comprises forming a sacrificial semiconductor structure around all of the plurality of hardmask fins.

11. A method for forming semiconductor fins, comprising:
epitaxially growing a sacrificial semiconductor structure around a plurality of hardmask fins from a top surface of an underlying semiconductor layer;

performing a first etch that partially etches away a portion of the hardmask fins and the sacrificial semiconductor structure with a first etch chemistry;

performing a second etch that etches away remaining material of the portion of the hardmask fins and partially etches remaining material of the sacrificial semiconductor structure with a second etch chemistry that is different from the first etch chemistry, wherein the first and second etch leave a remaining portion of the hardmask fin with substantially vertical sidewalls; and etching a plurality of semiconductor fins from the underlying semiconductor layer using the etched hardmask fins as a mask.

12. The method of claim 11, wherein the second etch leaves a layer of remaining material of the sacrificial semiconductor structure and exposes the underlying semiconductor layer under the portion of the hardmask fin.

13. The method of claim 11, further comprising etching away remaining portions of the sacrificial semiconductor structure after the second etch.

14. The method of claim 13, wherein etching away the remaining portions of the sacrificial semiconductor structure employs a third etch chemistry that is selective to the etched hardmask fins and the underlying semiconductor layer.

15. The method of claim 11, further comprising:
forming a mask over the hardmask fins that leaves the portion of the hardmask fins exposed, after forming the sacrificial semiconductor structure.

16. The method of claim 11, wherein the first etch comprises an etch chemistry selected from the group consisting of $CH_3F$ and $CF_x$.

17. The method of claim 11, wherein the second etch comprises an etch chemistry selected from the group consisting of $Cl_2$, $SF_6$, and HBr.

18. A method for forming semiconductor fins, comprising:
epitaxially growing a sacrificial semiconductor structure around a plurality of hardmask fins from a top surface of an underlying semiconductor layer;

forming a mask over the hardmask fins that leaves a portion of the hardmask fins exposed, after forming the sacrificial semiconductor structure;

performing a first etch that partially etches away a portion of the hardmask fins and the sacrificial semiconductor structure at the same time with a first etch chemistry;

performing a second etch that etches away remaining material of the portion of the hardmask fins and partially etches remaining material of the sacrificial semiconductor structure with a second etch chemistry that is different from the first etch chemistry, wherein the first and second etch leave a remaining portion of the hardmask fins with substantially vertical sidewalls;

performing a third etch that etches away remaining portions of the sacrificial semiconductor structure after the second etch and that is selective to the etched hardmask fins and the underlying semiconductor layer; and etching a plurality of semiconductor fins from the underlying semiconductor layer using the etched hardmask fins as a mask.

19. The method of claim 18, wherein the first etch comprises an etch chemistry selected from the group consisting of $CH_3F$ and $CF_x$.

20. The method of claim 18, wherein the second etch comprises an etch chemistry selected from the group consisting of $Cl_2$, $SF_6$, and HBr.

* * * * *